United States Patent
Leuten et al.

(10) Patent No.: US 12,237,300 B2
(45) Date of Patent: Feb. 25, 2025

(54) THROUGH-SUBSTRATE VOID FILLING FOR AN INTEGRATED CIRCUIT ASSEMBLY

(71) Applicant: Intel Corporation, Santa Clara, CA (US)

(72) Inventors: Tyler Leuten, Orangeville, CA (US); Yi Xu, Folsom, CA (US); Eleanor Patricia Paras Rabadam, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 855 days.

(21) Appl. No.: 17/113,341

(22) Filed: Dec. 7, 2020

(65) Prior Publication Data

US 2022/0181294 A1    Jun. 9, 2022

(51) Int. Cl.
    *H01L 23/48*     (2006.01)
    *H01L 21/56*     (2006.01)
    *H01L 23/00*     (2006.01)
    *H01L 23/13*     (2006.01)
    *H01L 23/31*     (2006.01)
    (Continued)

(52) U.S. Cl.
    CPC .......... *H01L 25/0652* (2013.01); *H01L 21/56* (2013.01); *H01L 23/13* (2013.01); *H01L 23/3135* (2013.01); *H01L 24/16* (2013.01); *H01L 24/17* (2013.01); *H01L 24/48* (2013.01); *H01L 25/18* (2013.01); *H01L 25/50* (2013.01); *H01L 2224/16227* (2013.01);
    (Continued)

(58) Field of Classification Search
    CPC ..... H01L 25/0652; H01L 21/56; H01L 23/13; H01L 23/3135; H01L 24/48; H01L 25/18; H01L 25/50; H01L 2224/48145; H01L 2224/48227

USPC ......................................................... 257/777
See application file for complete search history.

(56) References Cited

U.S. PATENT DOCUMENTS

| | | |
|---|---|---|
| 6,404,062 B1 | 6/2002 | Taniguchi et al. |
| 9,252,095 B2 | 2/2016 | Kim et al. |

(Continued)

FOREIGN PATENT DOCUMENTS

| | | |
|---|---|---|
| JP | 2009290011 | 2/2014 |
| JP | 2014222703 | 11/2014 |

OTHER PUBLICATIONS

Extended European Search Report for European Patent Application No. 21198361.4, dated Jun. 29, 2022.

(Continued)

*Primary Examiner* — Caleb E Henry
*Assistant Examiner* — Dilinh P Nguyen
(74) *Attorney, Agent, or Firm* — Essential Patents Group, LLP

(57) ABSTRACT

Integrated circuit assemblies may contain various mold, fill, and/or underfill materials. As these integrated circuit assemblies become ever smaller, it becomes challenging to prevent voids from forming within these materials, which may affect the reliability of the integrated circuit assemblies. Since integrated circuit assemblies are generally formed by electrically attaching integrated circuit dice on electronic substrates, the present description proposes injecting the mold, fill, and/or underfill materials through openings formed in the electronic substrate to fill voids that may form and/or to prevent the formation of the voids altogether.

20 Claims, 5 Drawing Sheets

(51) Int. Cl.
    *H01L 23/52*         (2006.01)
    *H01L 25/00*         (2006.01)
    *H01L 25/065*       (2023.01)
    *H01L 25/18*         (2023.01)

(52) U.S. Cl.
    CPC ............... *H01L 2224/17135* (2013.01); *H01L 2224/48145* (2013.01); *H01L 2224/48227* (2013.01)

(56) References Cited

U.S. PATENT DOCUMENTS

| | | |
|---|---|---|
| 2003/0113952 A1 | 6/2003 | Sambasivam et al. |
| 2004/0183193 A1 | 9/2004 | Koide et al. |
| 2006/0063303 A1 | 3/2006 | Koide et al. |
| 2007/0045867 A1 | 3/2007 | Machida |
| 2014/0038354 A1 | 2/2014 | Hong |
| 2020/0212005 A1* | 7/2020 | Fang ................. H01L 23/49811 |

OTHER PUBLICATIONS

Partial European Search Report for European Patent Application No. 21198361.4, dated Mar. 18, 2022.

* cited by examiner

THROUGH-SUBSTRATE VOID FILLING FOR AN INTEGRATED CIRCUIT ASSEMBLY

TECHNICAL FIELD

Embodiments of the present description generally relate to the field of integrated circuit package or assembly fabrication, and, more specifically, to filling voids within the integrated circuit assembly by injecting a fill material through an electronic substrate of the integrated circuit assembly.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

One way to achieve these goals is by increasing integration density, such as by stacking components within the integrated circuit assemblies. One stacking method may comprise a method typically used in NAND memory die stacking, wherein the backside surface of the largest integrated circuit die, such as a non-volatile memory die (for example, a 3D XPoint device) is attached to an electronic substrate (e.g. a package substrate/interposer, a printed circuit board, or the like) having a surface with bond pads thereon, of the controller die facing in a direction opposite the electronic substrate. Backside surfaces of smaller integrated circuit dice, such as NAND memory dice, are stacked on the largest integrated circuit die in a configuration to allow access to the bond pads. Bond wires are then used to form electrical connections between the bond pads on various integrated circuit dice and/or between the integrated circuit dice and the electronic substrate. A mold material may then be disposed over the assembly to protect the integrated circuit dice and the bond wires. Although such an assembly configuration may prevent any voids from being formed in the mold material, the configuration may not be the most advantageous configuration from a reliability and operational standpoint. A more advantageous configuration may be to stack the smaller integrated circuit dice on the electronic substrate and attach the largest integrated circuit die to the smaller integrated circuit dice. However, film over wire layers may be needed between the stacks to prevent bond wire shorting and reduce the risk of voids in the mold material. Furthermore, spacers, such as silicon spacers, may also be needed to evenly distribute the smaller integrated circuit dice stacks. Both film over wire layers and spacers add cost and increase the height of the integrated circuit assemblies, which is counter to the goals of the integrated circuit industry.

Additionally, as the goals of the integrated circuit industry are achieved, packaging of the integrated circuit devices becomes more challenging. A typical integrated circuit package includes at least one integrated circuit device that is mounted on an electronic substrate, such that bond pads, or other such electrical attachment structure, on the integrated circuit device are attached directly to corresponding bond lands, or other such electrical attachment structure, on the electronic substrate with interconnection structures. To enhance the reliability of the connection between the integrated circuit device bond pads and the electronic substrate bond lands, an underfill material may be disposed between the integrated circuit device and the electronic substrate for mechanical reinforcement.

Underfill materials are generally low viscosity materials, such as low viscosity epoxy materials, which may be dispensed from a dispensing needle along at least one edge of the integrated circuit device or die. The underfill material is drawn between the integrated circuit device and the electronic substrate by capillary action, and the underfill material is subsequently cured (hardened). However, as integrated circuit devices become smaller, there is a reduction in the size of the gap between the integrated circuit device and the electronic substrate, a reduction of the size of the gap between the integrated circuit device and neighboring components, and a reduction of the interconnection structure pitch (spacing). If the viscosity of the underfill material is too high, voids can form therein. Prevention of this voiding requires decreasing the viscosity and/or improving the wettability of the underfill material in order to wick between the integrated circuit device and the electronic substrate. The decreased viscosity and/or improved wettability can result in the underfill material "bleeding out" beyond the gap between the integrated circuit device and the electronic substrate and covering valuable surface area on the electronic substrate and/or interfering with other components in the integrated circuit assembly. One way to prevent such underfill bleed out is through the fabrication of containment structures, such as dams, trenches, and the like. However, these containment structures add cost to the integrated circuit assembly and still require a portion of the valuable surface area on the electronic substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following detailed description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings and/or schematics, such that the advantages of the present disclosure can be more readily ascertained, in which:

DETAILED DESCRIPTION

Figure 1:
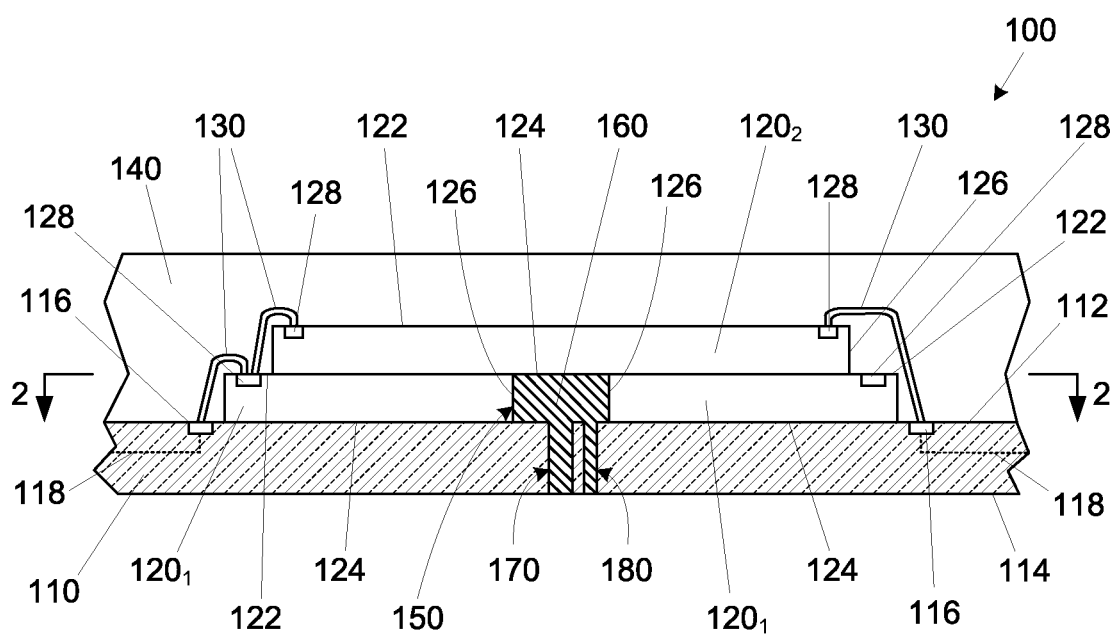
FIG. 1 is a side cross-sectional view of an integrated circuit assembly, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "printed circuit board" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

As will be understood to those skilled in the art, integrated circuit assemblies may contain various mold, fill, and/or underfill materials. As these integrated circuit assemblies become ever smaller, it becomes challenging to prevent voids from forming within these materials, which may affect the reliability of the integrated circuit assemblies. Since integrated circuit assemblies are generally formed by electrically attaching integrated circuit dice on electronic substrates, the embodiments of the present description relate to injecting the mold, fill, and/or underfill materials through openings formed in the electronic substrate to fill voids that may form and/or to prevent the formation of the voids altogether.

FIG. 1 illustrates an integrated circuit assembly 100 having at least one integrated circuit die (illustrated as at least two first level integrated circuit dice $120_1$ attached to an electronic substrate 110 and at least one second level integrated circuit die $120_2$ attached to the at least two first level integrated circuit dice $120_1$, according to an embodiment of the present description.

The electronic substrate 110 may be any appropriate device, including, but not limited to, a passive substrate (such as a package substrate or interposer, a printed circuit board, and the like) or a combination of an active device (not shown), such as, a microprocessor, a chipset, a graphics device, a wireless device, a memory device, an application specific integrated circuit, combinations thereof, stacks thereof, or the like, embedded in the passive electronic substrate.

The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The electronic substrate 110 may further include conductive routes 118 or "metallization" (shown in dashed lines) extending through the electronic substrate 110. The bond pads 116 on the first surface 112 of the electronic substrate 110 may be in electrical contact with the conductive routes 118, and the conductive routes 118 may extend through the electronic substrate 110 and be electrically connected to external components (not shown).

As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, aluminum, alloys thereof, and the like. As will be understood to those skilled in the art, the electronic substrate 110 may be a cored substrate or a coreless substrate.

The integrated circuit dice $120_1$, $120_2$ may be any appropriate active devices, including, but not limited to, microprocessors, chipsets, graphics devices, wireless devices, memory devices, application specific integrated circuits, or the like, an may be any appropriate passive device, including, but not limited to capacitors, resistors, inductors, and the like.

Each of the integrated circuit dice $120_1$, $120_2$ may include a first surface 122, an opposing second surface 124, and at least one side 126 extending between the first surface 122 and the second surface 124. Each of the integrated circuit dice $120_1$, $120_2$ may further include at least one bond pad 128 on the first surfaces 122 thereof. As illustrated, the second surfaces 124 of the at least two first level integrated circuit dice $120_1$ may be attached to the first surface 112 of the electronic substrate 110, and the second surface 124 of the second level integrated circuit die $120_2$. It is understood that the second level integrated circuit die $120_2$ is positioned to avoid interference with the bond pads 128 on the first level integrated circuit dice $120_1$. In an embodiment of the present description shown in FIG. 1, the first level integrated circuit dice $120_1$ and the second level integrated circuit die $120_2$ may be electrically attached to the electronic substrate 110 through at least one bond wire 130 extending between the bond pads 128 of the first level integrated circuit dice $120_1$ and the bond pads 116 of the electronic substrate 110 and between the bond pads 128 of the second level integrated circuit die $120_2$ and the bond pads 116 of the electronic substrate 110, respectively. Additionally, the first level integrated circuit dice $120_1$ and the second level integrated circuit die $120_2$ may be electrically attached to one another through at least one bond wire 130 extending between the bond pads 128 of the first level integrated circuit dice $120_1$ and the bond pads 128 of the second level integrated circuit dice $120_2$.

An electrically-insulating mold material 140, such as an epoxy material, may be disposed over the integrated circuit dice $120_1$, $120_2$ and the electronic substrate 110, and may substantially surround each bond wire 130. The mold material 140 may provide structural integrity and may prevent contamination, as will be understood to those skilled in the art.

As shown in FIG. 1, the stack configuration of the first level integrated circuit dice $120_1$ and the second level integrated circuit die $120_2$ can result in at least one void 150 forming in areas where the mold material 140 does not flow, such as tunnels and blind cavities. In one embodiment shown in FIG. 1, the at least one void 150 may be defined by the first surface 112 of the electronic substrate 110, the sides 126 of the first level integrated circuit dice 120$_1$, and the second surface 124 of the second level integrated circuit die 120$_2$. The mold material 140 itself may additionally define the at least one void 150, as will be understood.

As shown in FIG. 1, the electronic substrate 110 may include at least one inlet opening 170 extending from the first surface 112 to an opposing second surface 114 of the electronic substrate 110. The inlet opening 170 may be used to introduce a fill material 160, such as an epoxy material, into the at least one void 150, and, thus, at least a portion of the fill material 160 will extend into the inlet opening 170. In one embodiment, the fill material 160 may be dispensed into the void 150 as a viscous liquid and then hardened with a curing process. It may be advantageous to form at least one vent opening 180 extending from the first surface 112 to the second surface 114 of the electronic substrate 110, such that the assembly can be flipped over and the fill material 160 dispensed into the void 150, such that ambient atmosphere may be vented out of the vent opening 180 as the fill material 160 fills the void 150. In one embodiment of the present description, the fill material 160 may be substantially the same material as the mold material 140. In an embodiment of the present description, the fill material 160 may be injected under positive pressure into the inlet opening 170 from the second surface 114 of the electronic substrate 110. In an embodiment of the present description, the at least one inlet opening 170 and/or the at least one vent opening 180 may be made by any known process, including, but not limited to, laser drilling, ion ablation, etching, and the like. In a specific embodiment, the at least one inlet opening 170 and/or the at least one vent opening 180 may be formed as a plated through hole, as known in the art.

Figure 2:
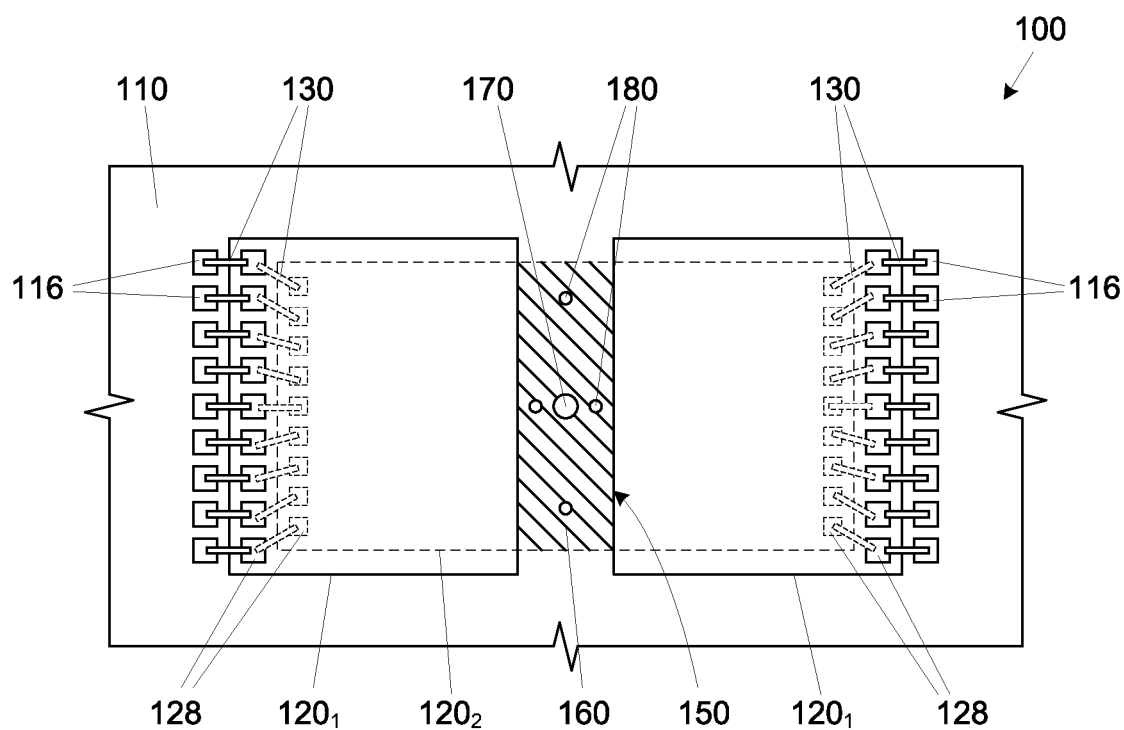
FIG. 2 is a view along line 2-2 of FIG. 1 of an integrated circuit die configuration, according to an embodiment of the present description.

As shown in FIG. 2, the integrated circuit assembly 100 may comprise two first level integrated circuit dice 120$_1$, one second level integrated circuit die 120$_2$, one inlet opening 170, and four vent openings 180. It is noted that the mold material 140 (see FIG. 1) is not shown and the second level integrated circuit die 120$_2$ and associated components are shown in shadow for clarity.

Figure 3:
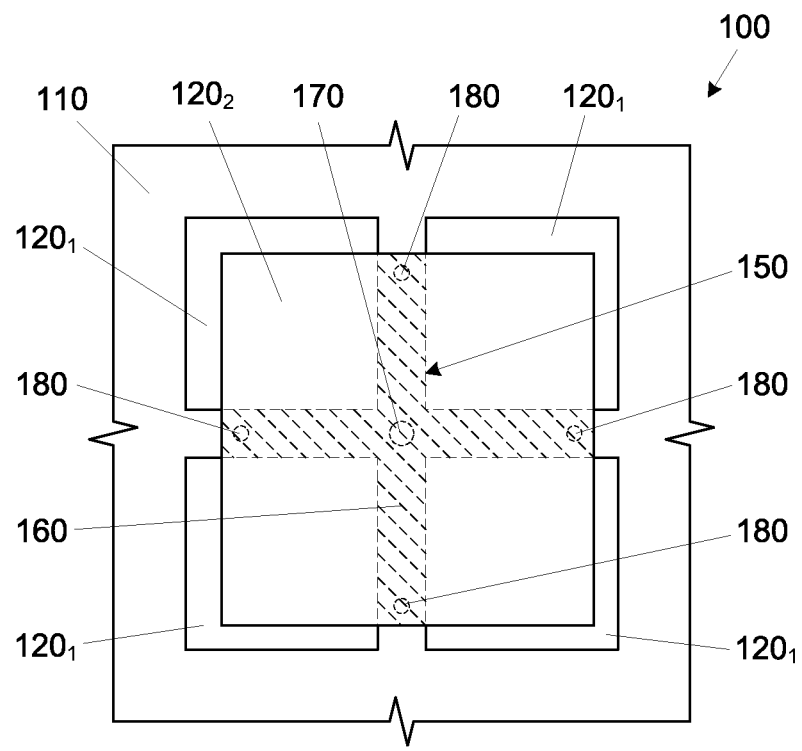
FIG. 3 is a view along line 2-2 of FIG. 1 of an alternate integrated circuit die configuration, according to an embodiment of the present description.

As shown in FIG. 3, the integrated circuit assembly 100 may have any appropriate number of integrated circuit dice. In one embodiment, the integrated circuit assembly 100 may comprise four first level integrated circuit dice 120$_1$, one second level integrated circuit die 120$_2$, one inlet opening 170, and four vent openings 180. It is noted that the mold material 140 (see FIG. 1), the bond wires 130, and associated bond pads are not shown for clarity.

Figure 4:
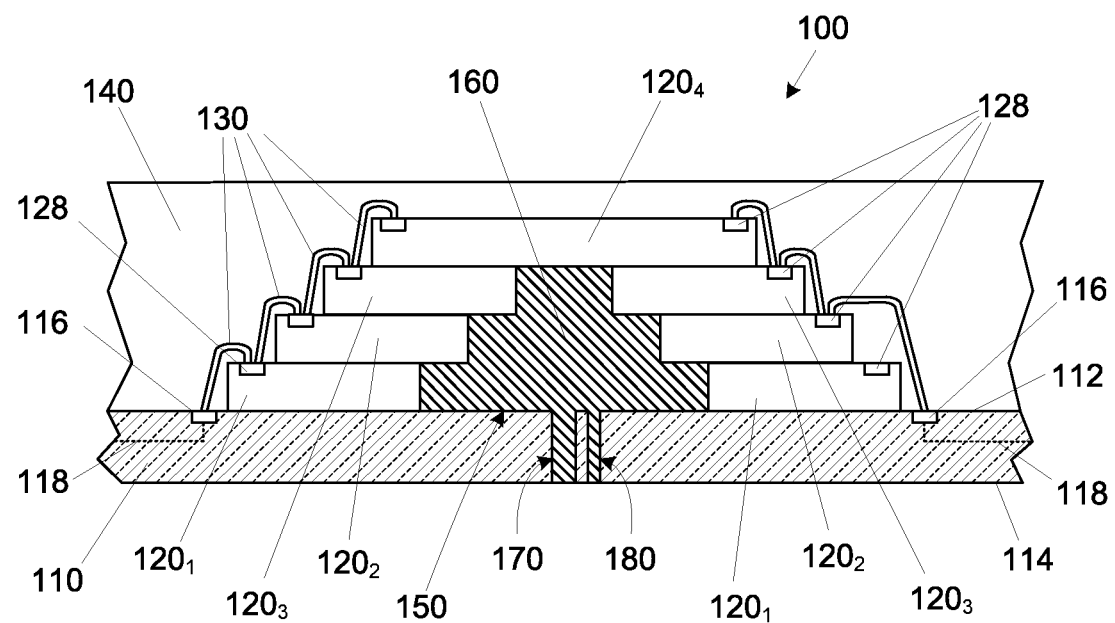
FIG. 4 is a side cross-sectional view of an integrated circuit assembly, according to another embodiment of the present description.

Although FIG. 1 illustrates two levels of integrated circuit dice, the embodiments of the present description are not so limited and can include any number of levels. In one example, an embodiment of the present description has four levels of integrated circuit dice, i.e. first level dice 120$_1$, second level dice 120$_2$, third level dice 120$_3$, and fourth level die 120$_4$, as shown in FIG. 4.

Figure 5:
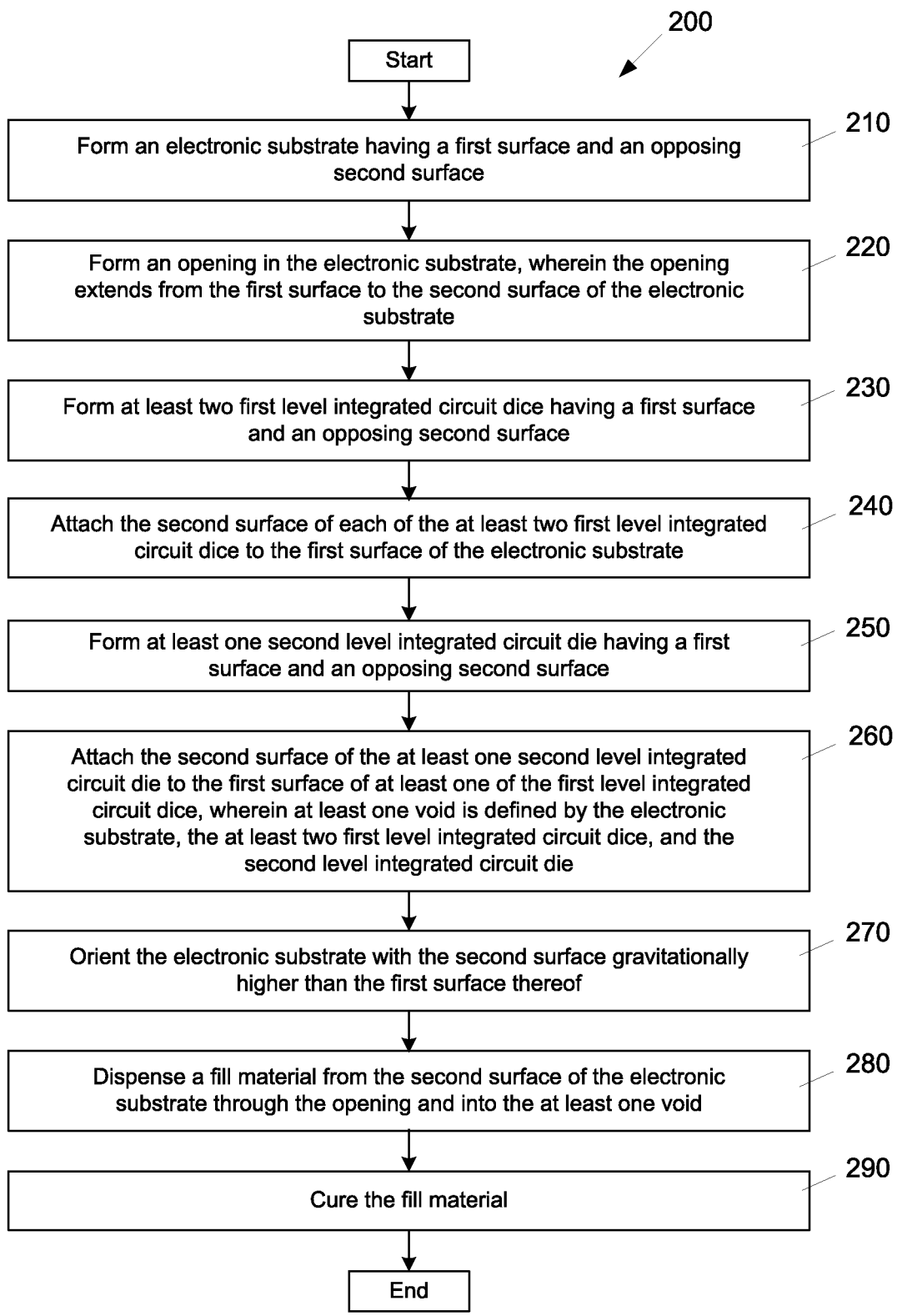
FIG. 5 is a flow chart of a process of fabricating an integrated circuit assembly, according to an embodiment of the present description.

FIG. 5 is a flow chart of a process 200 of fabricating an integrated circuit assembly. As set forth in block 210, an electronic substrate having a first surface and an opposing second surface may be formed. An opening may be formed in the electronic substrate, wherein the opening extends from the first surface to the second surface of the electronic substrate, as set forth in block 220. As set forth in block 230, at least two first level integrated circuit dice may be formed having a first surface and a second surface. The second surface of each of the at least two first level integrated circuit dice may be attached to the first surface of the electronic substrate, as set forth in block 240. As set forth in block 250, at least one second level integrated circuit die may be formed having a first surface and a second surface. The second surface of the at least one second level integrated circuit die may be attached to the first surface of at least one of the first level integrated circuit dice, wherein at least one void is defined by the electronic substrate, the at least two first level integrated circuit dice, and the second level integrated circuit die, as set forth in block 260. As set forth in block 270, the electronic substrate may be oriented with the second surface gravitationally higher than the first surface thereof. A fill material may be dispensed from the second surface of the electronic substrate through the opening and into the at least one void, as set forth in block 280. As set forth in block 290, the fill material may be cured.

Figure 6:
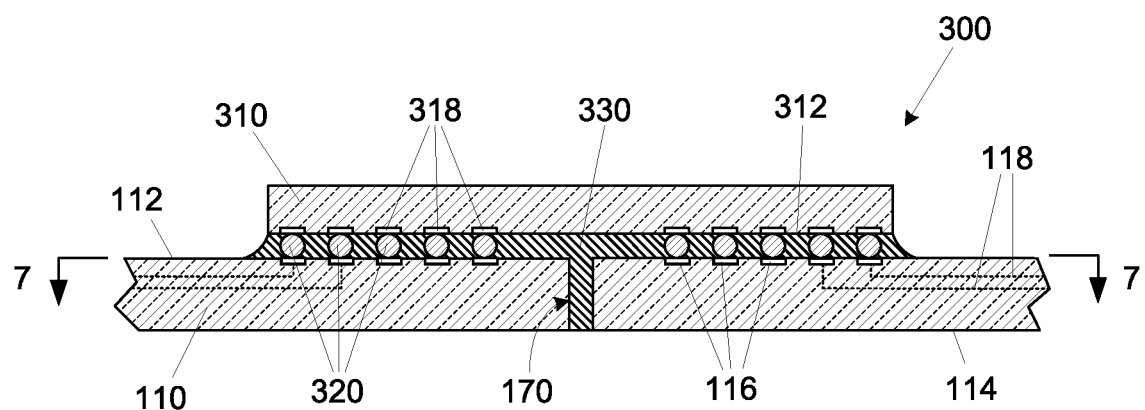
FIG. 6 is a side cross-sectional view of an integrated circuit assembly, according to an embodiment of the present description.

FIG. 6 illustrates a further embodiment of the present description comprising an integrated circuit assembly 300 having at least one integrated circuit device 310 attached to the electronic substrate 110 in a configuration generally known as a flip-chip or controlled collapse chip connection ("C4") configuration, according to an embodiment of the present description. The integrated circuit device 310 may be any appropriate active device, as described with regard to integrated circuit dice 120$_1$, 120$_2$ of FIG. 1.

In an embodiment of the present description shown in FIG. 6, the integrated circuit device 310 may be attached to the electronic substrate 110 with a plurality of device-to-substrate interconnects 320. In one embodiment of the present description, the device-to-substrate interconnects 320 may extend between the bond pads 116 on the first surface 112 of the electronic substrate 110 and bond pads 318 on a first surface 312 of the integrated circuit device 310.

In one embodiment, the device-to-substrate interconnects 320 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The device-to-substrate interconnects 320 may be in electrical communication with integrated circuitry (not shown) within the integrated circuit device 310.

An electrically-insulating underfill material 330, such as an epoxy material, may be disposed between the integrated circuit device 310 and the electronic substrate 110 to substantially surround each device-to-substrate interconnect of the plurality of device-to-substrate interconnects 320. The underfill material 330 may provide structural integrity and may prevent contamination, as will be understood to those skilled in the art. As discussed with regard to FIG. 1, the electronic substrate 110 may include at least one inlet opening 170 extending from the first surface 112 to the second surface 114 of the electronic substrate 110, as previously discussed. The inlet opening 170 is used to introduce the underfill material 330 between the integrated circuit device 310 and the electronic substrate 110, and, thus, at least a portion of the underfill material 330 will extend into the inlet opening 170. In one embodiment, the underfill material 330 may be dispensed between the first surface 312 of the integrated circuit device 310 and the first surface 112 of the electronic substrate 110 as a viscous liquid and then hardened with a curing process. In an embodiment of the present description, the underfill material 330 may be injected under positive pressure into the inlet opening 170 from the second surface 114 of the electronic substrate 110, which reduces or eliminates capillary action as the driving force for the distribution of the underfill material 330.

Figure 7:
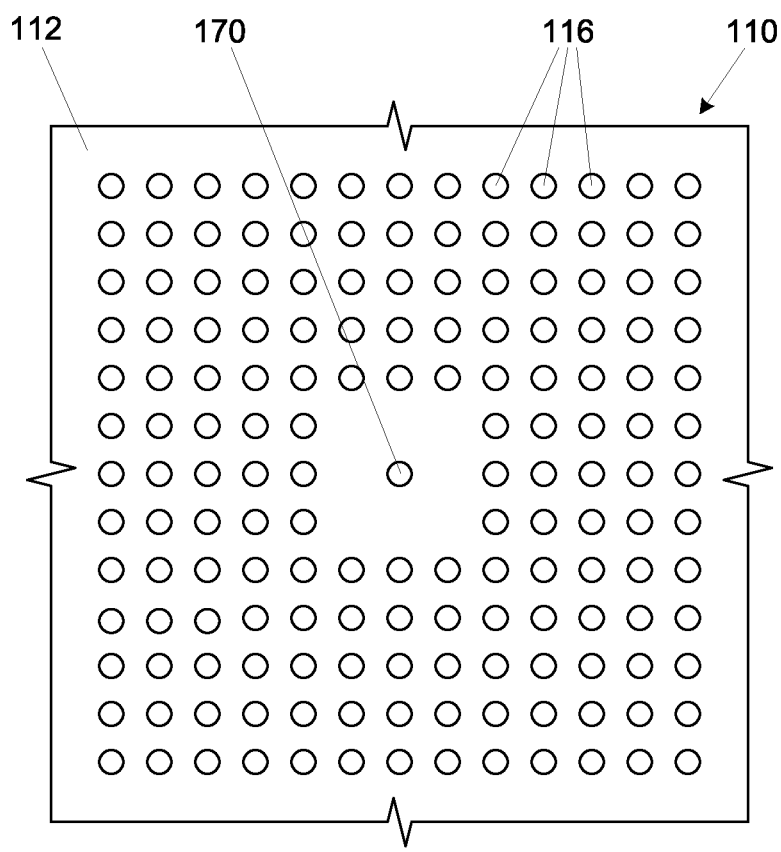
FIG. 7 is a view along line 7-7 of FIG. 6, according to an embodiment of the present description.

FIG. 7 illustrates a view along line 7-7 of FIG. 6. As shown, the inlet opening 170 may be substantially centrally located within a substantially symmetrical array of bond pads 116 of the electronic substrate 110. However, it is understood that the inlet opening 170 may be located in any position to achieve the shortest flow time of the underfill material 330, particularly when the bond pads 116 (and hence the device-to-substrate interconnects 320 (see FIG. 6)) have a non-symmetrical arrangement.

Figure 8:
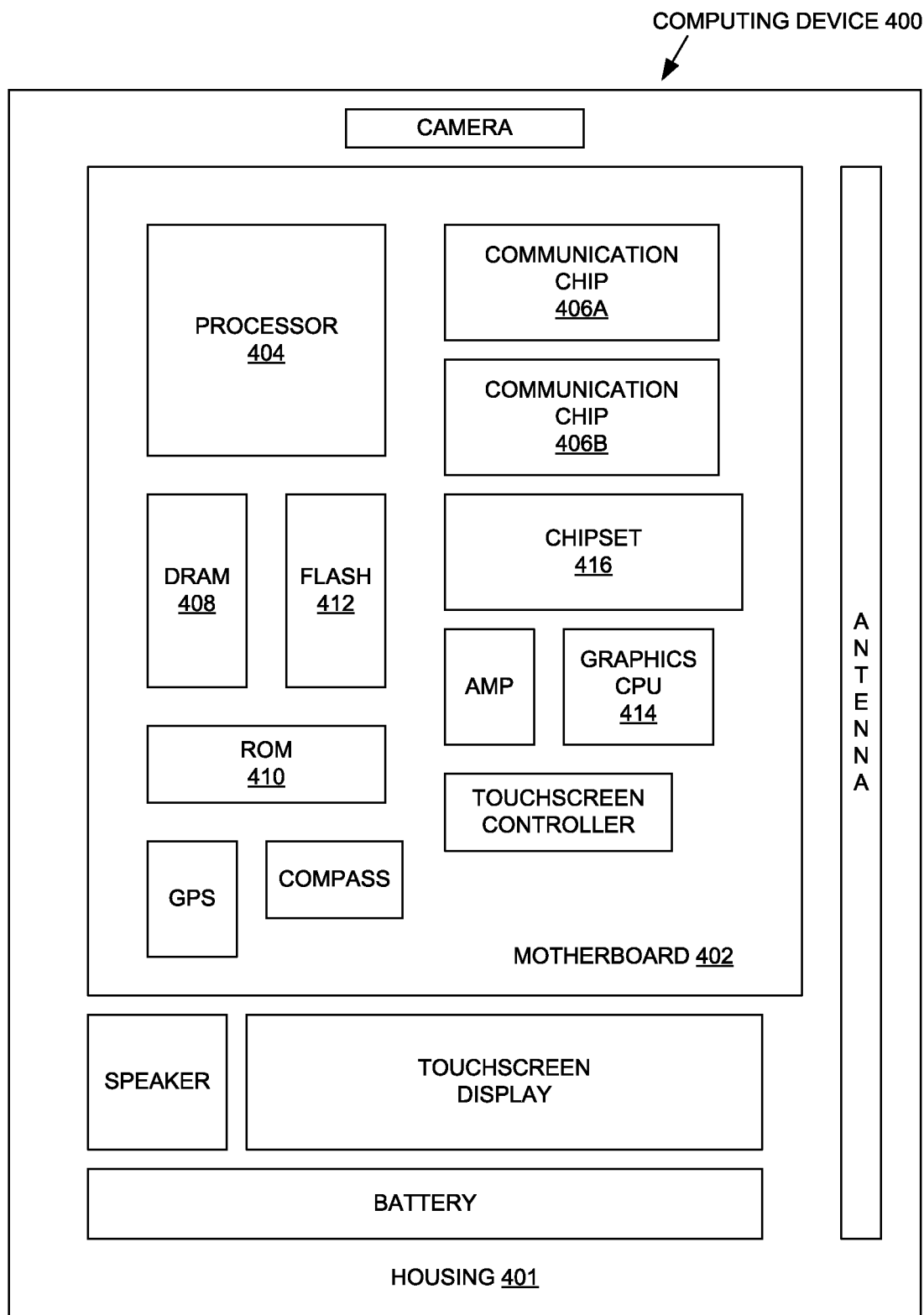
FIG. 8 is an electronic system, according to one embodiment of the present description.

FIG. 8 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

In one embodiment, at least one of the integrated circuit components may include an electronic substrate having a first surface and an opposing second surface, wherein the electronic substrate includes at least one inlet opening extending from the first surface to the second surface, at least one integrated circuit die attached to the electronic substrate; at least one void defined by the electronic substrate and the integrated circuit die; and a fill material within the at least one void, wherein a portion of the fill material extends into the opening in the electronic substrate.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising an electronic substrate having a first surface and an opposing second surface, wherein the electronic substrate includes at least one inlet opening extending from the first surface to the second surface, at least one integrated circuit die attached to the electronic substrate; at least one void defined by the electronic substrate and the integrated circuit die; and a fill material within the at least one void, wherein a portion of the fill material extends into the opening in the electronic substrate.

In Example 2, the subject matter of Example 1 can optionally include a mold material on the electronic substrate and the at least one of the integrated circuit dice.

In Example 3, the subject matter of Example 2 can optionally include the at least one void being further defined by the mold material.

In Example 4, the subject matter of any of Examples 1 to 3 can optionally include at least one vent opening extending from the first surface of the electronic substrate to the second surface of the electronic substrate.

In Example 5, the subject matter of any of Examples 1 to 4 can optionally include a portion of the fill material extending into the vent opening.

Example 6 is an electronic system, comprising an electronic substrate having a first surface and an opposing second surface, wherein the electronic substrate includes at least one opening extending from the first surface to the second surface; at least two first level integrated circuit dice having a first surface and an opposing second surface, wherein the second surface of each at least two integrated first level integrated circuit attached to the electronic substrate; at least one second level integrated circuit die having a first surface and an opposing second surface, wherein the second surface of second level integrated circuit die is attached to the first surface of at least one of the first level integrated circuit dice; at least one void defined by the electronic substrate, the at least two first level integrated circuit dice, and the second level integrated circuit die; and a fill material within the at least one void, wherein a portion of the fill material extends into the inlet opening in the electronic substrate.

In Example 7, the subject matter of Example 6 can optionally include the electronic substrate further comprises at least one vent opening extending from the first surface of the electronic substrate to the second surface of the electronic substrate.

In Example 8, the subject matter of Example 7 can optionally include a portion of the fill material extending into the vent opening.

In Example 9, the subject matter of any of Examples 6 to 8 can optionally include a mold material on the electronic substrate, the at least two first level integrated circuit dice, and the second level integrated circuit die.

In Example 10, the subject matter of Example 9 can optionally include the at least one void being further defined by the mold material.

In Example 11, the subject matter of Example 9 can optionally include the fill material being substantially the same as the mold material.

In Example 12, the subject matter of any of Examples 6 to 11 can optionally include at least one of the at least two first level integrated circuit dice and the at least one second level integrated circuit die being electrically attached to the electronic substrate with at least one bond wire.

In Example 13, the subject matter of any of Examples 6 to 12 can optionally include at least one of the at least two first level integrated circuit dice being electrically attached to the at least one second level integrated circuit die with at least one bond wire.

Example 14 is a method of fabricating an integrated circuit assembly comprising forming an electronic substrate having a first surface and an opposing second surface; forming an opening in the electronic substrate, wherein the opening extends from the first surface of the electronic substrate to the second surface of the electronic substrate; forming at least two first level integrated circuit dice having a first surface and an opposing second surface; attaching the second surface of each at least two integrated first level integrated circuit to the first surface of the electronic substrate; forming at least one second level integrated circuit die having a first surface and an opposing second surface; attaching the second surface of the at least one second level integrated circuit die to the first surface of at least one of the first level integrated circuit dice, wherein at least one void is defined by the electronic substrate, the at least two first level integrated circuit dice, and the second level integrated circuit die; orienting the electronic substrate with the second surface gravitationally higher than the first surface thereof; dispensing a fill material from the second surface of the electronic substrate through the inlet opening and into the at least one void; and curing the fill material.

In Example 15, the subject matter of Example 14 can optionally include a portion of the fill material extending into the inlet opening.

In Example 16, the subject matter of any of Examples 14 and 15 can optionally include forming at least one vent opening extending from the first surface of the electronic substrate to the second surface of the electronic substrate.

In Example 17, the subject matter of Example 16 can optionally include a portion of the fill material extending into the at least one vent opening.

In Example 18, the subject matter of Example 14 to 17 can optionally include forming a mold material on the electronic substrate, the at least two first level integrated circuit dice, and the second level integrated circuit die.

In Example 19, the subject matter of Example 18 can optionally include the at least one void being further defined by the mold material.

In Example 20, the subject matter of any of Examples 18 to 19 can optionally include the fill material is substantially the same as the mold material.

In Example 21, the subject matter of any of Examples 14 to 21 can optionally include electrically attaching at least one of the at least two first level integrated circuit dice and the at least one second level integrated circuit die to the electronic substrate with at least one bond wire.

In Example 22, the subject matter of any of Examples 14 to 21 can optionally include electrically attaching at least one of the at least two first level integrated circuit dice to the at least one second level integrated circuit die with at least one bond wire.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   an electronic substrate having a first substrate surface opposing a second substrate surface, wherein the electronic substrate includes an opening extending from the first substrate surface to the second substrate surface;
   an integrated circuit die attached to the electronic substrate, wherein the integrated circuit die has a first die surface opposing a second die surface that faces the first substrate surface; and
   a body of fill material in direct contact with the first substrate surface and in direct contact with the integrated circuit die, wherein a portion of the body of fill material extends into the opening in the electronic substrate; and
   a body of mold material over a portion of the first substrate surface beyond a side of the integrated circuit die and over at least a portion of the first die surface.

2. The integrated circuit assembly of claim 1, wherein the body of mold material is in direct contact with a first side of the integrated circuit die and the body of fill material is in direct contact with another side of the integrated circuit die.

3. The integrated circuit assembly of claim 2, wherein a portion of the body of mold material is in direct contact with a portion of the body of fill material.

4. The integrated circuit assembly of claim 1, further comprising at least one bond wire coupled to the integrated circuit die, and wherein the body of mold material is in contact with the bond wire.

5. The integrated circuit assembly of claim 1, wherein:
   the opening is a first opening proximal to a center of a footprint of the integrated circuit die; the assembly further comprises a plurality of second openings proximal to a periphery of the footprint of the integrated circuit die, each of the second openings extending from the first substrate surface to the second substrate surface; and
   the body of fill material extends into at least one of the second openings.

6. The integrated circuit assembly of claim 5, wherein each of the second openings is between the body of mold material and the first opening.

7. The integrated circuit assembly of claim 1, wherein the opening comprises a plated through hole.

8. The integrated circuit assembly of claim 1, wherein:
   the integrated circuit die is a first integrated circuit die;
   the assembly further comprises:
      a second integrated circuit die laterally adjacent to the first integrated circuit die; and
      a third integrated circuit over at least a portion of the first integrated circuit die, over at least a portion of the second integrated circuit die, and spanning a space between a side of the first integrated circuit die and a side of the second integrated circuit die;

the opening is within the space; and the body of fill material is in direct contact with the side of the first integrated circuit die and the side of the second integrated circuit die.

9. An electronic system, comprising:

an electronic substrate having a first substrate surface opposing a second substrate surface, wherein the electronic substrate includes an opening extending from the first substrate surface to the second substrate surface;

at least two first level integrated circuit dice, each having a first die surface opposing a second die surface, wherein the second die surface of each of the first level integrated circuit dice is attached to the electronic substrate;

at least one second level integrated circuit die having a first die surface opposing a second die surface, wherein the second die surface of the second level integrated circuit die is attached to the first die surface of at least one of the first level integrated circuit dice, wherein the second level integrated circuit die is over a space between the first level integrated circuit dice, and wherein the space is over the opening; and a body of fill material within the space, wherein a first portion of the body of fill material is in direct contact with the two first level integrated circuit dice and a second portion of the body of fill material extends into the opening in the electronic substrate.

10. The electronic system of claim 9, wherein the opening is a first opening and wherein the electronic substrate further comprises a plurality of second openings extending from the first substrate surface to the second substrate surface.

11. The electronic system of claim 10, further comprising a portion of the fill material extending into the at least one of the second openings.

12. The electronic system of claim 10, further comprising a mold material on the electronic substrate beyond a side of each of the two first level integrated circuit dice, in contact with the side of each of the two first level integrated circuit dice, and over the first surface of the second level integrated circuit die.

13. The electronic system of claim 12, wherein the body of mold material is in direct contact with the body of fill material.

14. The electronic system of claim 12, wherein the body of fill material has a composition that is substantially the same as a composition of the mold material.

15. The electronic system of claim 12, wherein at least one of the two first level integrated circuit dice and the second level integrated circuit die are electrically attached to the electronic substrate with at least one bond wire and the body of mold material is in contact with the bond wire.

16. The electronic system of claim 12, wherein at least one of the two first level integrated circuit dice is electrically attached to the second level integrated circuit die with at least one bond wire and the body of mold material is in contact with the bond wire.

17. The electronic system of claim 12, wherein each of the second openings is between the body of mold material and the first opening.

18. The electronic system of claim 17, wherein the body of mold material encircles the first level integrated circuit dice.

19. The electronic system of claim 9, wherein the body of fill material is absent from between the second surface of each of the first level integrated circuit dice and the first surface of the electronic substrate.

20. The electronic system of claim 19, wherein the body of fill material is in direct contact with a portion of the second surface of the second level integrated circuit die.

* * * * *